United States Patent
Metzger

(10) Patent No.: US 6,673,509 B1
(45) Date of Patent: Jan. 6, 2004

(54) PHOTOPOLYMERIZABLE RECORDING ELEMENT AND PROCESS FOR PREPARING FLEXOGRAPHIC PRINTING FORMS

(75) Inventor: Berhnard Metzger, Landau (DE)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/511,833

(22) Filed: Feb. 24, 2000

(30) Foreign Application Priority Data

Mar. 2, 1999 (DE) ......................................... 199 09 152

(51) Int. Cl.$^7$ .................................................. G03C 1/76
(52) U.S. Cl. ................. 430/270.1; 430/259; 430/281.1; 430/286.1; 430/944
(58) Field of Search .......................... 430/270.1, 281.1, 430/286.1, 502, 503, 944, 289

(56) References Cited

U.S. PATENT DOCUMENTS

| | | | |
|---|---|---|---|
| 3,203,805 A | 8/1965 | Burg .......................... 96/115 |
| 4,323,637 A | 4/1982 | Chen et al. .................. 430/271 |
| 4,427,759 A | 1/1984 | Gruetzmacher et al. .... 430/273 |
| 4,592,946 A | * 6/1986 | Shuman ...................... 428/200 |
| 4,711,834 A | 12/1987 | Butters et al. .............. 430/201 |
| 4,894,315 A | 1/1990 | Feinberg et al. ............ 430/281 |
| 5,155,003 A | * 10/1992 | Chang ........................ 430/200 |
| 5,262,275 A | * 11/1993 | Fan ............................. 430/273 |
| 5,372,910 A | 12/1994 | Metzger et al. ............. 430/202 |
| 5,552,259 A | * 9/1996 | Bloom et al. ............... 430/253 |
| 5,607,814 A | * 3/1997 | Fan et al. .................... 430/258 |
| 5,719,009 A | * 2/1998 | Fan ............................. 430/306 |

FOREIGN PATENT DOCUMENTS

| | | | |
|---|---|---|---|
| EP | 0741330 A1 | 11/1996 | |
| EP | 0 767 407 A 1 | 4/1997 | ............. G03F/1/00 |
| WO | WO 94/03838 | 2/1994 | ............. G03F/7/09 |
| WO | WO 94/03839 | 2/1994 | ............. G03F/7/095 |
| WO | WO 96/16356 | 5/1996 | ............. G03F/7/095 |

\* cited by examiner

Primary Examiner—Janet Baxter
Assistant Examiner—Yvette C. Thornton
(74) Attorney, Agent, or Firm—Thomas H. Magee

(57) ABSTRACT

The invention relates to a photopolymerizable recording element and process for preparing flexographic printing forms, whereby the photo-polymerizable recording element comprises a support, at least one photo-polymerizable layer, an adhesive wax layer, and a layer sensitive to infrared radiation and opaque to actinic radiation.

12 Claims, No Drawings

PHOTOPOLYMERIZABLE RECORDING ELEMENT AND PROCESS FOR PREPARING FLEXOGRAPHIC PRINTING FORMS

BACKGROUND OF THE INVENTION

1. Field of the Invention

The invention involves a photopolymerizable recording element and a process for preparing flexographic printing forms. The photopolymerizable recording element comprises at least one support, at least one photopolymerizable layer containing at least one polymeric binder, at least one ethylenically unsaturated, copolymerizable, organic compound and at least one photoinitiator or photoinitiator system, and a layer sensitive to infrared radiation and opaque to actinic radiation.

2. Description of Related Art

The use of photopolymerizable recording elements for preparing flexographic printing forms is known. The printing surface is produced by exposing a photopolymerizable layer imagewise to actinic radiation and subsequently removing unexposed unphotopolymerized areas. Examples are found in U.S. Pat. Nos. 4,323,637; 4,427,759; and 4,894,315. Such photopolymerizable recording elements usually comprise a support, optionally an adhesive or other underlayer, one or more photopolymerizable layers containing at least one polymeric binder, at least one monomer, at least one photoinitiator, and optionally, an elastomeric intermediate layer and a cover layer.

The photopolymerizable recording elements are usually exposed imagewise by superposing a photographic original, removing air through a vacuum frame, and exposing overall. The photographic original is usually a mask, mostly a photographic negative, having areas opaque to actinic radiation and those that are transparent to actinic radiation. The transparent areas permit photopolymerization by actinic irradiation of the underlying areas of the photopolymerizable layer. The opaque areas of the mask prevent photopolymerization of the underlying areas of the photopolymerizable layer, so that these can be removed during development. Photographic originals having separating or slip layers containing wax are disclosed in U.S. Pat. No. 4,711,834. German Patent DE-C 39 41 493 describes color proof recording materials with wax layers between the color-imparting pigment layer and the imagewise exposed layer of the recording material.

The disclosed photographic originals have many disadvantages, such as, for example, sensitivity to temperature and moisture or complicated and time-consuming correction possibilities. Therefore, digital methods and associated materials that do not require a photographic negative have been developed. Such recording materials comprise a conventional recording element, as previously described, and additionally an integrated mask. These are described in WO 94/03838, WO 94/03839, WO 96/16356, and EP-A 0 767 407. The integrated mask is a layer sensitive to infrared and opaque to actinic radiation. This infrared-sensitive layer is imaged digitally, whereby the infrared-sensitive material is vaporized or transferred onto a superposed film. Subsequent overall exposure of the photopolymerizable element through the resulting mask, washing off unpolymerized areas and the remaining areas of the infrared-sensitive layer, and drying the element yield a flexographic printing form. These recording materials can also contain various auxiliary layers between the photo-polymerizable layer and the infrared-sensitive layer.

However, such prior art recording elements have some disadvantages. One is that the adhesion of the infrared-sensitive layer on the photopolymerizable layer or optionally on intermediate auxiliary layers is frequently inadequate, resulting in faulty release of the infrared-sensitive layer. In addition, these infrared-sensitive layers are extremely fragile and are very easily damaged mechanically during handling in production operation.

Therefore, the problem involved in the present invention is to make available photopolymerizable recording elements for preparing flexographic printing forms, which do not show the disadvantages of prior art materials, and do not adversely affect other essential properties of the photopolymerizable recording elements or the flexographic printing forms prepared therefrom.

SUMMARY OF THE INVENTION

The problem was solved by the present invention which provides a photopolymerizable recording element comprising a support, at least one photopolymerizable layer containing at least one polymeric binder, at least one ethylenically unsaturated, copolymerizable, organic compound, and at least one photoinitiator or photoinitiator system, and a layer sensitive to infrared radiation and opaque to actinic radiation, characterized by the presence of an adhesive wax layer between the photopolymerizable layer and the infrared-sensitive layer. The present invention further includes a process for preparing flexographic printing forms by using such recording elements.

DESCRIPTION OF THE PREFERRED EMBODIMENT(S)

The present invention is a photopolymerizable recording element which includes a support, at least one photopolymerizable layer containing at least one polymeric binder, at least one ethylenically unsaturated, copolymerizable, organic compound, and at least one photoinitiator or photoinitiator system, and a layer sensitive to infrared radiation and opaque to actinic radiation, characterized by the presence of an adhesive wax layer between the photopolymerizable layer and the infrared-sensitive layer.

Surprisingly, the wax layer increases the adhesion of the infrared-sensitive layer to the photopolymerizable layer. This was all the more astonishing, as wax is customarily used as a separating or slip layer, as is described in DE-C 39 41 493 for color proof printing and in U.S. Pat. No. 4,711,834 for conventional photo originals. Another advantage of the present invention is that the mechanical sensitivity of the infrared-sensitive layer can be largely eliminated by the added wax layer. In addition, laser exposure requires about 15% less energy than with the use of infrared layers without a wax layer.

The wax layer of the present invention is 0.02–1.0 micron thick, preferably 0.05–0.5 micron. Suitable waxes are all natural and synthetic waxes, in particular polyolefin waxes, paraffin waxes, carnauba waxes, montan waxes, and stearin and/or steramide waxes. Preferred waxes have a softening temperature $\geq 70°$ C., preferably 80–160° C., particularly preferred 90–150° C. In particular, polyethylene waxes having a softening temperature above 90° C. are suitable for preparing the adhesive wax layer (which may also be identified as the adhesive layer or wax layer) of the present invention.

The wax layer of the present invention can be prepared by conventional methods, such as, for example, casting, printing, or spraying dispersions in suitable solvents and subsequent drying. Additives such as surfactants, coating aids, etc. can be used. The wax layer is applied preferably by gravure printing either on the infrared-sensitive layer or on the photopolymerizable recording element. In particular, application on the infrared-sensitive layer is preferred.

The preferred infrared-sensitive layer is soluble or dispersible in the developer, opaque to ultraviolet or visible light, that is, has an optical density $\geq 2.5$, and can be imaged with an infrared laser. This layer contains material having high infrared absorption in the wavelength range between 750 and 20,000 nm, such as, for example, polysubstituted phthalocyanine compounds, cyanine dyes, merocyanine dyes, etc., inorganic pigments, such as, for example, carbon black, graphite, chromium dioxide, etc., or metals, such as aluminum, copper, etc. The quantity of infrared absorbing material is usually 0.1–40% by weight, relative to the total weight of the layer. To achieve the optical density $\geq 2.5$ with actinic radiation, the infrared-sensitive layer contains a material that prevents the transmission of actinic radiation, such as, for example, dyes or pigments, in particular the aforesaid inorganic pigments. The quantity of this material is usually 1–70% by weight relative to the total weight of the layer. This layer contains optionally a polymeric binder, such as, for example, nitrocellulose, homopolymers or copolymers of acrylates, methacrylates and styrenes, polyamides, polyvinyl alcohols, etc. Other auxiliary agents, such as plasticizers, coating aids, etc. are possible. The infrared-sensitive layer is usually prepared by coating or printing a solution or dispersion of the aforesaid components on a strippable cover layer, for example, of polyethylene or polyethylene terephthalate, and subsequently drying it. The thickness of the infrared-sensitive layer is usually 2 nm to 50 microns, preferably 4 nm to 40 microns. These infrared-sensitive layers and their preparation are described in detail, for example, in WO 94/03838 and WO 94/3839.

The resulting cover element of a strippable coversheet, an infrared-sensitive layer, and an adhesive wax layer according to the invention is then combined with a photopolymerizable layer so that the adhesive wax layer is in contact with the photopolymerizable layer. This can be done by laminating the described cover element on a photopolymerizable recording element comprising a support, at least one photopolymerizable layer, and optional layers, such as, for example, a bonding layer between the photopolymerizable layer and the support or a barrier layer on the photopolymerizable layer. The cover element is laminated onto the surface of the photopolymerizable layer facing the adhesive wax layer of the invention. Alternatively, the photopolymerizable layer is extruded directly between the aforesaid cover element and the support, with or without auxiliary layers.

Suitable photopolymerizable layers are all known materials usually containing an elastomeric binder, a monomer, and a photoinitiator. Examples of suitable elastomeric binders are polyalkanedienes; alkadiene/acrylonitrile copolymers; ethylene/propylene/alkadiene copolymers; ethylene/(meth)acrylic acid/(meth)acrylate copolymers; and thermoplastic, elastomeric, block copolymers of styrene, butadiene, or isoprene. Linear and radial thermoplastic, elastomeric, block copolymers of styrene and butadiene or isoprene are preferred. The quantity of binder is preferably 65% by weight, relative to the total weight of the layer.

Useful monomers are the conventional ethylenically unsaturated, copolymerizable, organic compounds, such as, for example, acrylates and methacrylates of monovalent or polyvalent alcohols; (meth)acrylamides; vinyl ethers and vinyl esters; etc., in particular, acrylic and/or methacrylic esters of butanediol, hexanediol, diethylene glycol, trimethylol propane, pentaerythritol, etc.; and mixtures of such compounds. The monomer quantity is preferably at least 5% by weight, relative to the total weight of the composition of the photopolymerizable layer.

Useful photoinitiators can be individual photoinitiators or photoinitiator systems, such as, for example, benzoin derivatives, benzil acetals, diarylphosphine oxides, etc., also mixed with triphenyl phosphine, tertiary amines, etc. The quantity of photoinitiators is usually 0.001–10% by weight, relative to the total weight of the layer. The photopolymerizable materials optionally also contain auxiliary materials, such as, for example, inhibitors, plasticizers, dyes, coating aids, etc.

The photopolymerizable layer is 0.05–0.13 cm for the so-called "thin plates" and 0.25–0.64 cm for thicker plates. One or more of these layers can be used. The photopolymerizable layers are prepared by mixing the components and processing the mixtures by the usual techniques, such as, for example, casting, calendering, extruding, etc. Conventional photopolymerizable materials and their preparation are known to the expert. Examples of particularly preferred photopolymerizable materials and their preparation and processing are described in U.S. Pat. No. 4,323,637; U.S. Pat. No. 4,427,759; and U.S. Pat. No. 4,894,315.

The processing steps for the recording element of the present invention include imagewise exposure with an IR laser, overall exposure with actinic radiation, development, drying, and post treatment, which are described thoroughly in WO 94/03838 or WO 94/3839.

First the infrared-sensitive layer is exposed with an infrared laser, for example, a diode laser emitting between 750 and 880 nm, preferably 780 and 850 nm, or a YAG laser emitting at 1060 nm. The optional strippable coversheet may be removed prior to the laser exposure, in which case the laser vaporizes the infrared-sensitive layer. If the coversheet remains on the recording element, the exposure by laser fixes the infrared-sensitive layer on the overlying coversheet and is stripped off upon removal of the coversheet.

The photopolymerizable recording element is exposed overall with conventional radiation sources, such as, for example, xenon lamps, carbon arc lamps, mercury vapor lamps, fluorescent lamps having phosphors emitting ultraviolet radiation, etc. The backside of the recording element can be exposed before or after the laser exposure or before or after the overall exposure. This can take place as diffuse lighting or focused from the aforementioned light sources.

The unphotopolymerized areas can be washed off, depending on the binder system, with water, aqueous or semiaqueous solutions, or suitable organic developer solvents, such as, for example, aliphatic or aromatic hydrocarbons, such as n-hexane; petroleum ether; hydrogenated petroleum fractions; limonene or other terpenes; toluene; isopropyl benzene etc.; ketones, such as, for example, methylethyl ketone; halogenated hydrocarbons, such as chloroform, trichloroethane, or tetrachloroethylene; esters, such as, for example, of acetic acid or acetoacetic acid; or mixtures of the named solvents. Additives, such as surfactants or alcohols, are possible. This step removes the unphotopolymerized areas of the photopolymerizable recording element, the remaining areas of the infrared-sensitive layer, adhesive wax layer, and a barrier layer that may optionally be present. After drying, the resulting printing form can be postexposed and/or chemically or physically treated in any sequence to prepare a nontacky printing surface.

The following examples will illustrate the present invention. Unless otherwise stated, the given parts and percentages are by weight.

EXAMPLES

A 1:2 mixture of carbon black (Printex® 300 from Degussa Company) and a polyamide binder having a softening point of 140° C. (Macromelt® 6900 from Henkel Company) in 1:1 toluene/isopropanol was applied by the gravure printing method on a polyester base (75 microns) in a layer of unit weight 2.5 g/m$^2$. After the coated base was dried, various wax dispersions (Table 1) were applied on test strips of the resulting carbon black layer with a hand doctor blade (50 microns) and dried at room temperature. After drying, the wax layers had the thicknesses shown in Table 1. Wax 5 was applied by the gravure printing method. These wax-coated carbon black layers were laminated at 100° C.–160° C. on a photopolymer printing plate (CYREL® HCS made by the Du Pont Company and having had the cover sheet removed beforehand) in a Cromalin® White Line laminator from the Du Pont Company, so that the wax layer faced the photopolymer layer. For comparison, a polyamide/carbon black layer without a wax layer was laminated under the same conditions. The polyester coversheet was manually stripped off the carbon black layer. The carbon black layer remained completely adhered on the photopolymer plate. The results are summarized in Table 2.

TABLE 1

| Wax Formulations | Concentration % by weight | Solvent | Layer Thickness (microns) |
|---|---|---|---|
| Wax 1 | 0.05 | Isopropanol | 0.03 |
| Wax 2 | 0.2 | Isopropanol | 0.1 |
| Wax 3 | 0.1 | Dipropyleneglycol ether | 0.05 |
| Wax 4 | 0.1 | Isopropanol | 0.05 |
| Wax 5 | 0.1 | Butoxyethanol/water (1:1) | 0.05 |

TABLE 2

| Waxes | Softening Temperature (° C.) | Particle Sizes (microns) | Adhesion to Photopolymer |
|---|---|---|---|
| Polyolefin wax | 93–99 | 3–6 | No delamination |
| Paraffin wax | 90–93 | 10–15 | No delamination |
| Carnauba wax | 82–86 | 1–3 | No delamination |
| Carnauba wax | 82–86 | 2–4 | No delamination |
| Polyethylene wax | 138–143 | 15–20 | No delamination |
| Carbon Black Layer (no wax) | | | Partial delamination |

Printing Test

In a machine test, a carbon black layer prepared as described above (on 75 micron polyester) was coated with the wax of Test 5 as described above and laminated as described above on a photopolymer printing plate (CYREL® DUV 45 from the Du Pont Company) at ca. 160° C. The polyester protective layer was then removed from the carbon black layer. Selective imagewise structures were ablated from the carbon black layer by a Cyrel® CDI laser imager from the DuPont Company (14 watts). The remaining imagewise areas of the carbon black layer served as a photomask in the subsequent exposure of the plate with actinic light in a Cyrel® 1001 E exposure device from the DuPont Company. After the exposure, the (unexposed) areas of the photopolymerizable layer protected by the carbon black layer (together with the remaining areas of the carbon black layer and the wax layer) were washed off with Optisol® as developer solvent from the DuPont Company in a developing device Cyrel® 2001 P from the DuPont Company. Printing tests were conducted with the resulting flexographic printing forms on paper and polypropylene sheets. The printing results showed no disadvantages or defects compared to standard printing forms. Furthermore, the tests showed that about 15% less energy was required for laser exposure than with the use of carbon black layers without wax.

What is claimed is:

1. A photopolymerizable recording element comprising a support, at least one photopolymerizable layer containing at least one polymeric binder, at least one ethylenically unsaturated, copolymerizable, organic compound, and at least one photoinitiator or photoinitiator system, and a layer sensitive to infrared radiation and opaque to actinic radiation, characterized in that an adhesive wax layer is present between the photopolymerizable layer and the infrared-sensitive layer.

2. The photopolymerizable recording element according to claim 1, characterized in that the wax layer is 0.02–1.0 micron thick.

3. The photopolymerizable recording element according to claim 2, characterized in that the wax layer is 0.05–0.5 micron thick.

4. The photopolymerizable recording element according to claim 1, characterized in that the wax layer comprises polyolefin waxes, paraffin waxes, carnauba waxes, montan waxes, and stearin and/or steramide waxes.

5. The photopolymerizable recording element according to claim 1, characterized in that the infrared-sensitive layer can be removed by infrared laser radiation.

6. The photopolymerizable recording element according to claim 5, characterized in that the infrared-sensitive layer contains carbon black.

7. The photopolymerizable recording element according to claim 1, characterized in that a bonding layer is present between the support and the photopolymerizable layer.

8. The photopolymerizable recording element according to claim 1, characterized in that a barrier layer is present between the photopolymerizable layer and the wax layer.

9. The photopolymerizable recording element according to claim 1, characterized in that a strippable cover layer is present on the surface of the infrared-sensitive layer away from the wax layer.

10. A process for preparing flexographic printing forms, wherein:
   a) the infrared-sensitive layer of a photopolymerizable recording element according to claim 1 is structured imagewise with an infrared laser to produce a mask,
   b) the photopolymerizable layer of the photopolymerizable recording element is photopolymerized imagewise by overall exposure with actinic radiation through the mask produced in a), and
   c) the unphotopolymerized areas of the photopolymerizable layer, the remaining areas of the infrared-sensitive layer, and the adhesive wax layer are removed by one or more developer solvents.

11. The process according to claim 10, characterized in that a strippable cover layer is present on the surface of the infrared-sensitive layer away from the wax layer, and the strippable cover layer is removed before the overall exposure.

12. A process for preparing flexographic printing forms from a photopolymerizable recording element according to claim 1, comprising:

a) exposing the infrared-sensitive layer imagewise with an infrared laser, producing a mask on the element;

b) overall exposing with actinic radiation the photopolymerizable layer of the recording element through the mask produced in a); and c) removing the unphotopolymerized areas of the photopolymerizable layer, the remaining areas of the infrared-sensitive layer, and the adhesive wax layer by one or more developer solvents.

* * * * *